(12) United States Patent
Goyal et al.

(10) Patent No.: US 11,892,505 B1
(45) Date of Patent: Feb. 6, 2024

(54) DEBUG AND TRACE CIRCUIT IN LOCKSTEP ARCHITECTURES, ASSOCIATED METHOD, PROCESSING SYSTEM, AND APPARATUS

(71) Applicant: STMicroelectronics International N.V., Geneva (CH)

(72) Inventors: Avneep Kumar Goyal, Greater Noida (IN); Anubhav Arora, Gurugram (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/945,576

(22) Filed: Sep. 15, 2022

(51) Int. Cl.
*G01R 31/317* (2006.01)
*G01R 31/3185* (2006.01)

(52) U.S. Cl.
CPC . *G01R 31/31705* (2013.01); *G01R 31/31726* (2013.01); *G01R 31/318597* (2013.01)

(58) Field of Classification Search
CPC ........ G01R 31/31705; G01R 31/31726; G01R 31/318597
USPC ................ 714/724, 727, 731, 736, 742, 744
See application file for complete search history.

(56) References Cited

U.S. PATENT DOCUMENTS

| | | | | |
|---|---|---|---|---|
| 5,892,897 | A * | 4/1999 | Carlson | G06F 11/1641 714/E11.061 |
| 6,601,189 | B1 * | 7/2003 | Edwards | G06F 11/3656 714/25 |
| 6,671,841 | B1 * | 12/2003 | Golshan | G01R 31/318544 714/729 |
| 7,194,671 | B2 * | 3/2007 | Tu | G06F 11/1645 714/E11.061 |
| 7,725,782 | B2 * | 5/2010 | Katrak | G11C 29/10 714/724 |
| 7,886,195 | B2 | 2/2011 | Mayer | |
| 10,452,446 | B1 | 10/2019 | Bloom et al. | |
| 10,459,413 | B2 | 10/2019 | Tegnell et al. | |

(Continued)

FOREIGN PATENT DOCUMENTS

EP 3869338 A1 8/2021

OTHER PUBLICATIONS

Hanafi et al., Dual-Lockstep Microblaze-Based Embedded System For Error Detection And Recovery With Reconfiguration Technique, 2015, IEEE, pp. 1-6. (Year: 2015).*

(Continued)

*Primary Examiner* — John J Tabone, Jr.
(74) *Attorney, Agent, or Firm* — Slater Matsil, LLP

(57) ABSTRACT

A processing system includes: main and shadow processing cores configured to operate in lockstep based on a core clock. The main processing core includes a main processing core and a main debug circuit. The shadow processing core includes a shadow functional core and a shadow debug circuit. A redundancy checker circuit is configured to assert an alarm signal when a discrepancy between outputs from the main and shadow functional cores is detected. A debug bus synchronizer circuit is configured to receive input debug data in synchrony with a debug clock, and provide synchronized debug data in synchrony with the core clock to a debug bus based on the input debug data, where the main and shadow debug circuits are configured to receive the synchronized debug data in synchrony with the core clock from the debug bus, and where the debug clock is asynchronous with respect to the core clock.

22 Claims, 5 Drawing Sheets

(56) References Cited

U.S. PATENT DOCUMENTS

| | | | |
|---|---|---|---|
| 10,754,760 | B1 | 8/2020 | Levy et al. |
| 10,831,628 | B2* | 11/2020 | Santoni .............. G06F 11/1695 |
| 11,360,864 | B2 | 6/2022 | Kollmer |
| 11,698,841 | B2* | 7/2023 | Nayyar ................ G06F 11/004 |
| | | | 716/136 |
| 2002/0144177 | A1* | 10/2002 | Kondo ............... G06F 11/1441 |
| | | | 714/13 |
| 2003/0023771 | A1* | 1/2003 | Erickson .................. G06F 9/24 |
| | | | 712/E9.007 |
| 2004/0123201 | A1* | 6/2004 | Nguyen ............. G06F 11/1654 |
| | | | 714/E11.061 |
| 2007/0022348 | A1 | 1/2007 | Racunas et al. |
| 2010/0122072 | A1 | 5/2010 | Yarimizu |
| 2010/0262811 | A1* | 10/2010 | Moyer ................ G06F 11/3632 |
| | | | 713/400 |
| 2011/0145630 | A1* | 6/2011 | Maciorowski ...... G06F 11/2007 |
| | | | 714/E11.073 |
| 2017/0004063 | A1* | 1/2017 | Broderick ........... G06F 11/3495 |
| 2019/0361786 | A1* | 11/2019 | Arai .................... G06F 11/3652 |
| 2022/0206065 | A1* | 6/2022 | Viswanathan Pillai ..................... |
| | | | G06F 11/2236 |
| 2022/0229752 | A1* | 7/2022 | Goyal ....................... G06F 1/06 |
| 2022/0350598 | A1* | 11/2022 | Guan ................... G06F 9/3001 |
| 2023/0297480 | A1* | 9/2023 | Nayyar ............... G06F 11/1641 |
| | | | 716/136 |

OTHER PUBLICATIONS

Peña-Fernández et al., Hybrid Lockstep Technique for Soft Error Mitigation, Jul. 2022, IEEE, vol. 69, No. 7, pp. 1574-1581. (Year: 2022).*

Doran et al., Dynamic Lockstep Processors for Applications with Functional Safety Relevance, Sep. 7, 2021, IEEE, pp. 1-4. (Year: 2021).*

* cited by examiner

DEBUG AND TRACE CIRCUIT IN LOCKSTEP ARCHITECTURES, ASSOCIATED METHOD, PROCESSING SYSTEM, AND APPARATUS

TECHNICAL FIELD

The present disclosure relates generally to an electronic system and method, and, in particular embodiments, to a debug and trace circuit in a lockstep architecture, associated method, processing system, and apparatus.

BACKGROUND

Safety in a system-on-a-chip (SoC) ranging from aerospace to internet-of-things (IoT). For example, automotive SoCs are generally designed to comply with ISO 26262 (which defines Automotive Safety Integrity Level (ASIL), such as ASIL-D), which brings quantitative measures to ensure implementation of safety mechanisms in the SoC design. Safety mechanism typically prevent and/or correct faults of the SoC and/or allow the SoC to take corrective action (e.g., reset the SoC, alert a user, etc.). Examples of safety mechanism used in an SoC include ECC protection on a signal bus, replication of design, watchdog timers, etc.

As an example, safety in processing cores may be implemented using replicated cores. Using replicate cores may advantageously aid in detecting faults, e.g., caused by spurious faults, which may corrupt the operation of the processing core. FIG. 1 shows a schematic diagram of exemplary processing system 100. Processing system 100 includes main processing core 102a, shadow processing core 102b, and debug and trace circuit 106, where shadow core 102b is a replica of main core iota.

As shown in FIG. 1, during functional mode ($S_{debug\_mode}=0$), main core 102a and shadow core 102b operate in lockstep mode, receiving the same functional inputs and, under a no-fault condition, generating the same outputs. Redundancy checker circuit 108 compares the outputs of main core 102a and shadow core 102b in a known manner and asserts (e.g., high) signal $S_{alarm}$ when a fault is detected (e.g., as a result of finding a discrepancy between the outputs of main core 102a and shadow core 102b). During functional mode ($S_{debug\_mode}=0$), the assertion of signal $S_{alarm}$ causes the triggering of a system alarm (which may be transmitted to a fault collection unit or safety circuit, e.g., available in the same SoC (not shown) and/or to an external user, such as another controller or processor). The triggering of the safety alarm may cause an external or internal circuit to take corrective action (e.g., reset the system 100, alert a user, place system 100 in safety mode, etc.)

Processing system 100 operates in a similar manner during debug mode ($S_{debug\_mode}=1$) as in functional mode ($S_{debug\_mode}=0$). During debug mode, however, debug and trace circuit 106 is operational. During debug mode:

debug logic no receives/provides data from the debug bus based on debug clock $CLK_{debug}$, and provides signal/bus $S_{debug}$ to main core iota based on data received from the debug bus;

cross trigger controller 112 receives/provides data from/to cross trigger bus based on cross trigger clock $CLK_{crossT}$ and provides/receives signal $S_{trigger}$ from/to debug logic 110;

timestamp receiver 114 receives timestamps from the timestamp bus based on timestamp clock $CLK_{stamp}$ and provides timestamp signal $S_{tamp}$ to trace generator 116; and trace generator receives/provides data from signal/bus $S_{trace}$ and provides/receives data to the trace bus based on trace clock $CLK_{trace}$.

Processing system 100 may enter debug mode, for example, when a debugger is connected to processing system 100 (e.g., signal $S_{debug\_mode}$ may become high when debugger is connected to main core 102a). The debugger may interface with debug and trace circuit 106 in a conventional manner, e.g., via the functional register programming bus and/or via other bus(es)/signal(s) (not shown in FIG. 1).

Debug and trace circuit 106 may be used to perform debug operations (e.g., setting programming breakpoints, pausing program execution, reading registers of main core 102a, etc.) and trace operations. Such operations are conventionally performed offline, e.g., during software/firmware development, for example.

As shown in FIG. 1, debug and trace circuit 106 interacts only with main core 102a (and does not interact with shadow core 102b). Thus, during debug mode, only main core 102a goes into debug mode (and shadow core 102b does not go into debug mode). It is thus highly probable that the output of shadow core 102b will be different than the output of main core 102b (e.g., when core 102a is paused but core 102b is not paused). Therefore, signal $S_{alarm}$ is gated so that the triggering of these false safety alarms is disabled to prevent the triggering of safety alarm during active debug mode (since, e.g., by design, the operation of main core 102a and shadow core 102b may be different as a result of debug operations that may only affect main core 102a). At application level the gating of the safety alarms of functional logic during debug mode may not be problematic when performing debug and trace operations offline.

SUMMARY

In accordance with an embodiment, a processing system includes: a main processing core including a main functional core and a main debug circuit, the main debug circuit having a debug input coupled to a debug bus and a debug output coupled to the debug bus; a shadow processing core including a shadow functional core and a shadow debug circuit, the shadow debug circuit having a debug input coupled to the debug bus, where the main and shadow processing cores are configured to operate in lockstep based on a core clock; a redundancy checker circuit configured to receive first outputs from the main and shadow functional cores and assert an alarm signal when a discrepancy between the first outputs from the main and shadow functional cores is detected; and a debug bus synchronizer circuit having a debug input configured to receive input debug data in synchrony with a debug clock, and an output coupled to the debug bus, where the debug bus synchronizer circuit is configured to provide synchronized debug data in synchrony with the core clock to the debug bus based on the input debug data, where the main and shadow debug circuits are configured to receive the synchronized debug data in synchrony with the core clock from the debug bus, and where the debug clock is asynchronous with respect to the core clock.

In accordance with an embodiment, a method includes: transitioning from a functional mode of a processing system to a debug mode of the processing system after a debugger is coupled to the processing system, the processing system including a main and shadow processing cores operating in lockstep; and during functional mode: receiving functional inputs with a main functional core of the main processing system and with a shadow functional core of the shadow processing system, processing the functional inputs in parallel with the main and shadow functional cores in synchrony with a core clock, receiving debug data from the debugger in synchrony with a debug clock, the debug clock being asynchronous with the core clock, synchronizing the debug data to the core clock and providing the synchronized debug data to a debug bus in synchrony with the core clock, receiving the synchronized debug data from the debug bus with a main debug circuit of the main processing core and with a shadow debug circuit of the shadow processing core, comparing outputs from the main and shadow functional cores and asserting an alarm signal when a discrepancy between the outputs from the main and shadow functional cores is detected, and reacting to the assertion of the alarm signal.

In accordance with an embodiment, a vehicle includes: a debug port; an electronic control unit (ECU); and a processing system including: a main processing core including a main functional core and a main debug circuit, the main debug circuit having a debug input coupled to a debug bus and a debug output coupled to the debug bus, a shadow processing core including a shadow functional core and a shadow debug circuit, the shadow debug circuit having a debug input coupled to the debug bus, where the main and shadow processing cores are configured to operate in lockstep based on a core clock; a redundancy checker circuit configured to receive first outputs from the main and shadow functional cores and assert an alarm signal at an output terminal when a discrepancy between the first outputs from the main and shadow functional cores is detected, the output terminal of the redundancy checker circuit being coupled to the ECU; and a debug bus synchronizer circuit having a debug input coupled to the debug port and configured to receive input debug data in synchrony with a debug clock from the debug port, and an output coupled to the debug bus, where the debug bus synchronizer circuit is configured to provide synchronized debug data in synchrony with the core clock to the debug bus based on the input debug data, where the main and shadow debug circuits are configured to receive the synchronized debug data in synchrony with the core clock from the debug bus, and where the debug clock is asynchronous with respect to the core clock.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
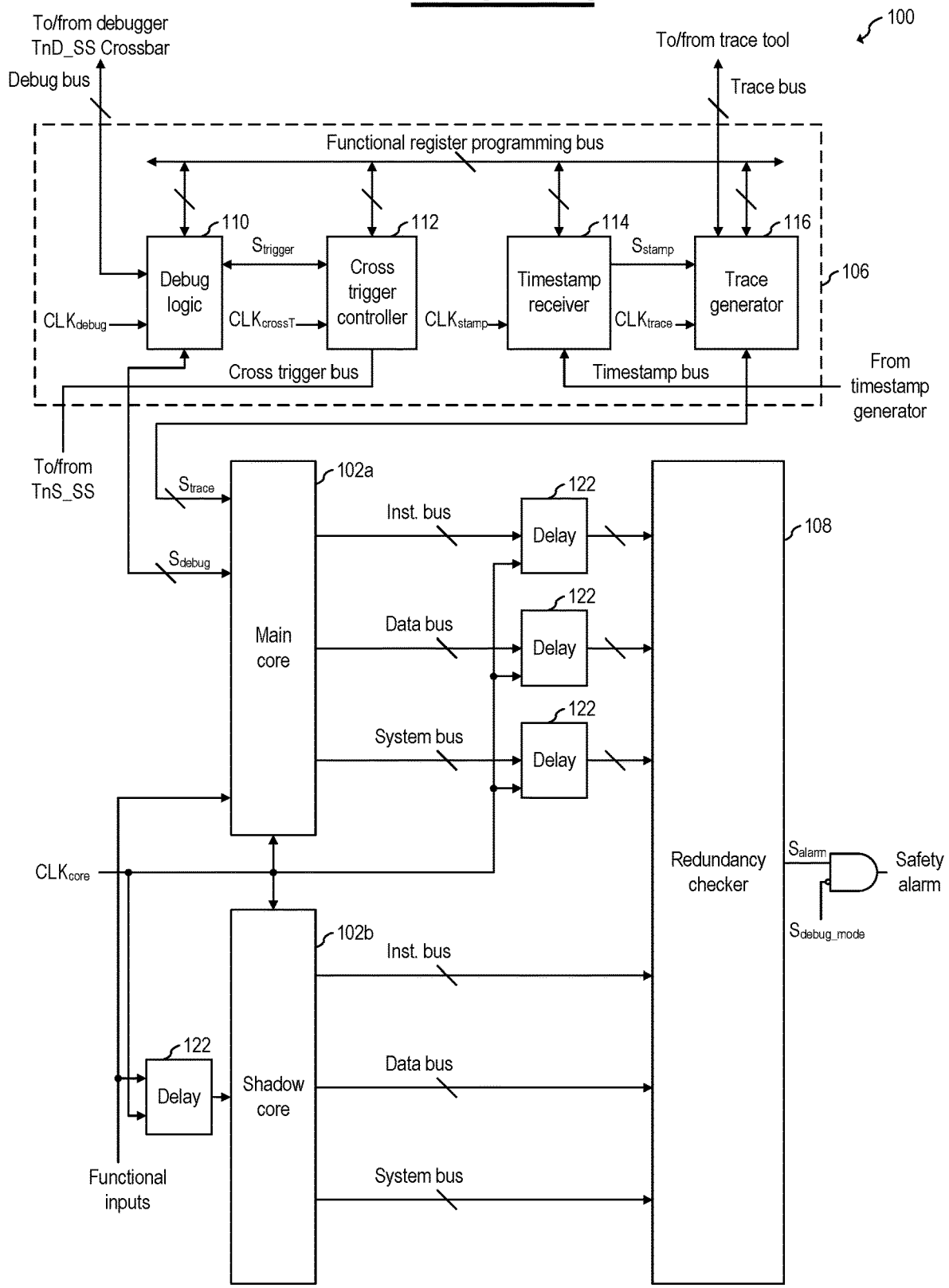
FIG. 1 shows a schematic diagram of an exemplary processing system.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a processing circuit having a main and shadow processing cores and capable of operating in a safe manner (e.g., capable of issuing safety alarms) during debug and trace operations, e.g., in automotive applications. Embodiments of the present invention may be used in other types of applications, such as industrial applications, for example. Some embodiments may implement debug operations without implementing trace operations.

In an embodiment of the present invention, a processing system that includes processing cores operating in lockstep provide unmasked safety alerts associated with faults of a core of the processing system during functional mode as well as during debug mode. Each processing core (main and shadow) of the processing system includes a respective debug and trace circuit. Uncertainty of clock domain crossing is handled using asynchronous bridges (synchronizers) outside the replicated logic, thereby allowing the replicated synchronizers inside the processing cores to work coherently (based on the core clock $CLK_{core}$), without exhibiting the uncertainty of clock domain crossings. Advantageously, functional faults are captured and reported when non-safety logic (e.g., debug and trace circuit) interferes with safety-relevant functional logic of the processing cores.

In some applications, operating a processing system during debug mode without safety capabilities may be problematic. For example, in some automotive applications, systems such as the braking system, steering system, throttling system, advanced driver assistance systems (ADAS), and other critical systems of the car may be debugged, or the performance of, e.g., a newly developed system analyzed, with an attached debugger while the car is being tested on actual roads. In some applications, a debugger is attached for recurrent updated software loading while the car is being tested on actual roads. Thus, the absence of safety capabilities, such as the triggering of the safety alarm when a fault is detected by a redundancy checker, may be catastrophic, and may result in injury or death of the occupants of the car.

Having safety capabilities enabled (with unmasked safety alarms) during debug mode also advantageously allows for the testing of safety logic with the debugger (e.g., using fault injection to generate safety alarms.

In an embodiment of the present invention, a debug and trace circuit is implemented inside each of the main and shadow cores so that a redundancy checker and safety alarm are operational during debug mode. In some embodiments, the processing circuit has the safety logic enabled and operational (with an unmasked safety alarm) when the debugger is connected.

The inventors realized that, due to asynchronous clock domains (e.g., $CLK_{debugs}$, $CLK_{crossT}$, $CLK_{stamp}$, and $CLK_{trace}$ may be asynchronous with respect to $CLK_{core}$), clock uncertainty (e.g., due to meta-stability problems inside synchronizers) may cause false positives in the triggering of the safety alarm when the debug and trace circuit is replicated in each of the main and shadow cores. For example, when a signal (e.g., $S_{debug}$) travels from one clock domain to another clock domain, the signal may take i (e.g., 2) clock cycles or i+1 (e.g., 3) clock cycles to propagate to the another clock domain depending on when the signal (e.g., $S_{debug}$) transitions with respect to the clock in the another clock domain. For example, when the signal transition at the same time as the sampling clock, it is possible that the signal is not sampled properly, and propagation of the signal takes an extra clock cycle). Such uncertainty of propagation of the signal (e.g., $S_{debug}$) to each of the main and shadow cores may cause the redundancy checker to assert $S_{alarm}$ because of the timing mismatch between the main and shadow cores. Such timing mismatch between the main and shadow cores may occur in an uncontrolled manner (and may be affected by aging and environmental factors), which may result in the uncontrolled triggering of the safety alarm.

In an embodiment of the present invention, debug and trace buses (e.g., debug bus, cross trigger bus, timestamp bus and trace bus) are synchronized to the core clock $CLK_{core}$ outside the main and shadow cores. The debug and trace buses are provided in a similar manner to the main and shadow cores, together with the core clock $CLK_{core}$ for synchronous operation, which may advantageously allow for implementing a debug and trace circuit inside each of the main and shadow cores while avoiding false positives associated with clock uncertainty, which may advantageously allow the safety alarm to be operational (not gated) during debug mode.

Figure 2:
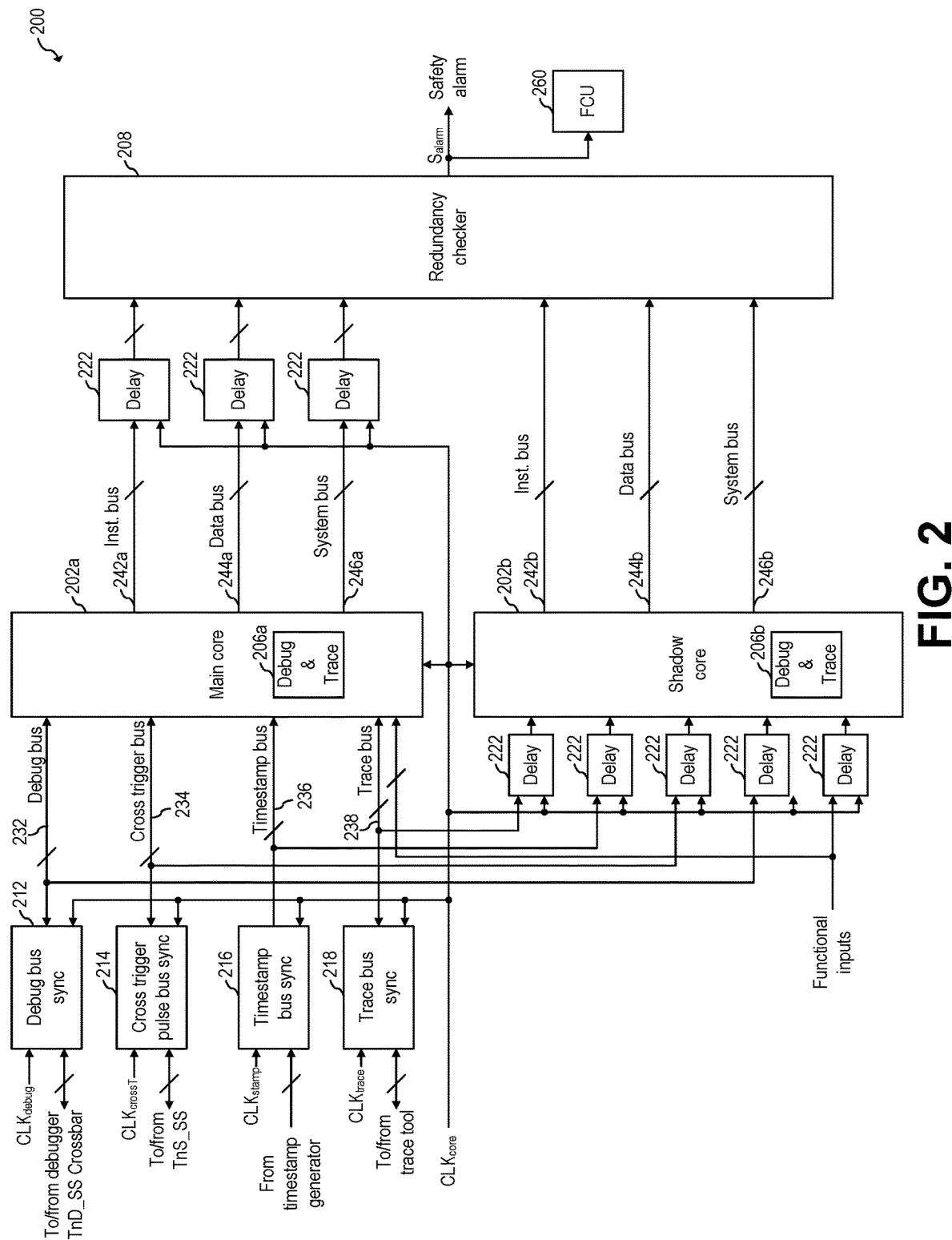
FIG. 2 shows a schematic diagram of a processing system, according to an embodiment of the present invention.

FIG. 2 shows a schematic diagram of processing system 200, according to an embodiment of the present invention. Processing system 200 includes main processing core 202a, shadow processing core 202b, redundancy checker 208, synchronization circuits 212, 214, 216, and 218, and delay circuits 222. Main processing core 202a includes debug and trace circuit 206a. Shadow processing core 202b includes debug and trace circuit 206b. Debug and trace circuits 206a and 206b are each coupled to buses 232, 234, 236, and 238. In some embodiments, processing system 200 includes fault collection unit (FCU) 260 for receiving and processing signal $S_{alarm}$.

Main processing core 202a and shadow processing core 202b are configured to operate in lockstep (performing the same set of operations in parallel). By operating in lockstep, processing system 100 may advantageously become fault tolerant by achieving spatial redundancy (since main and shadow cores 202a and 202b are implemented in spatially different portions of the layout of processing system 100.

In some embodiments, main processing core 202a and shadow processing core 202b are configured to achieve temporal redundancy by delaying the inputs to shadow processing core 202b by one or more clock cycles (e.g., 2 clock cycles) using delay circuits 222, and by delaying the outputs of main processing core 202a by the same number of cycles using delay circuits 222 so that the delays of the outputs of main and shadow cores 202a and 202b are balanced and redundancy checker 208 receives from main and shadow cores 202a and 202b signals without a temporal mismatch. Temporal redundancy may advantageously improve the fault tolerant capability or processing system 100 given the small probability that the same fault occurs successively exactly at the period established by the delay of delay circuits 222.

During functional mode ($S_{debug\_mode}$=0), main core 202a and shadow core 202b operate in lockstep mode, receiving the same functional inputs and, under a no-fault condition, generating the same outputs. Redundancy checker circuit 208 compares the outputs of main core 202a and shadow core 202b in a known manner and asserts (e.g., high) signal $S_{alarm}$ when a fault is detected (e.g., as a result of finding a discrepancy between the outputs of main core 202a and shadow core 202b). During functional mode ($S_{debug\_mode}$=0), the assertion of signal $S_{alarm}$ causes the triggering of a system alarm (which may be transmitted to FCU 260 or external user, such as to another controller or processor (not shown)). The triggering of the safety alarm may cause an external or internal circuit to take corrective action (e.g., reset the system 200, alert a user, place system 200 in safety mode, etc.). During functional mode, debug bus 232, cross trigger bus 234, timestamp bus 236, and trace bus 238 may be disabled (e.g., not powered, not switching, or ignored).

Processing system 200 operates in a similar manner during debug mode ($S_{debug\_mode}$=1) as in functional mode ($S_{debog\_mode}$=0), and main core 202a and shadow core 202b continue to operate in lockstep mode. During debug mode, however, debug and trace circuits 206a and 206b are operational (and thus, both cores 202a and 202b are in debug mode). Thus, during debug mode, debug and trace circuits 206a and 206b process and act on information from buses 232, 234, 236, and 238 in a similar manner, thereby allowing continued lockstep operation between the main and shadow cores 202a and 202b. As a result, redundancy checker 208 continues to be operational and is configured to trigger the safety alarm by asserting (the ungated) signal $S_{alarm}$ when a discrepancy between the outputs of main and shadow cores 202a and 202b is detected in a known manner. Since main and shadow cores 202a and 202b include respective debug and trace circuits (206a and 206b) and continue to operate in lockstep during debug mode, processing system 200 continues to benefit from the safety mechanism associated with lockstep operation (e.g., as provided by redundancy checker 208) during debug mode.

As can be seen in FIG. 2, processing system 200 includes synchronizers 212, 214, 216 and 218 to synchronize each of the respective clocks ($CLK_{debug}$, $CLK_{crossT}$ $CLK_{stamp}$ and $CLK_{trace}$) with a single core clock $CLK_{core}$ that is provided to main and shadow cores 202a and 202b. As a result, buses 232, 234, 236, and 238 are synchronous with clock $CLK_{core}$ (and a single clock $CLK_{core}$ is used to clock operations of the main and shadow cores 202a and 202b, in both debug mode and functional mode) thereby advantageously avoiding clock uncertainty that may cause false positives in the triggering of the safety alarm (since any clock uncertainty issue is propagated in a similar manner to both cores 202a and 202b, thereby avoiding a mismatch in outputs from cores 202a and 202b).

In some embodiments, during debug mode, debug bus synchronizer 212 is coupled to a debugger and is configured to synchronize data to/from the debugger with respect to debug clock $CLK_{debug}$ with core clock $CLK_{core}$. Thus, debug bus synchronizer 212 is configured to deliver data from the debugger and provide such data to debug bus 232 in synchrony with core clock $CLK_{core}$, and is configured to receive data from debug bus 232 and provide such data to the debugger in synchrony with debug clock $CLK_{debug}$.

In some embodiments, during debug mode, cross trigger pulse bus synchronizer 214 is coupled to one or more external controllers/processors and is configured to synchronize data to/from the one or more external controllers/processors with respect to cross trigger clock $CLK_{crossT}$ with core clock $CLK_{core}$. Thus, cross trigger pulse bus synchronizer 214 is configured to deliver data from the one or more external controllers/processors and provide such data to cross trigger bus 234 in synchrony with core clock $CLK_{core}$, and is configured to receive data from cross trigger bus 234 and provide such data to the one or more external controllers/processors in synchrony with cross trigger clock $CLK_{crossT}$.

In some embodiments, during debug mode, timestamp bus synchronizer 216 is coupled to a timestamp generator and is configured to synchronize data from the timestamp generator with respect to timestamp clock $CLK_{stamp}$ with core clock $CLK_{core}$. Thus, timestamp bus synchronizer 216 is configured to deliver data from the timestamp generator and provide such data to timestamp bus 236 in synchrony with core clock $CLK_{core}$.

In some embodiments, during debug mode, trace bus synchronizer 218 is coupled to a trace tool (e.g., via the debugger) and is configured to synchronize data to/from the trace tool with respect to trace clock $CLK_{trace}$ with core clock $CLK_{core}$. Thus, trace bus synchronizer 218 is configured to deliver data from the trace tool and provide such data to trace bus 238 in synchrony with core clock $CLK_{core}$, and is configured to receive data from trace bus 238 and provide such data to the trace tool in synchrony with trace clock $CLK_{trace}$.

In some embodiments, bus synchronizers 212, 214, 216, and 218 may be implemented in any way known in the art.

As shown in FIG. 2, buses 232, 234 and 238 are bidirectional buses. In some embodiments, during debug mode, data flows from buses 232, 234, and 238 to debug and trace circuits 206a and 206b and data flows from debug and trace circuit 206a (but not from debug and trace circuit 206b) to buses 232, 234, and 238. For example, in some embodiments, debug and trace outputs from debug and trace circuit 206b are open (e.g., not connected, or are ignored) and only outputs from debug and trace circuit 206a are used for debug and trace operations. Thus, in some embodiments, debug and trace outputs (from 206a and 206b) are not compared by redundancy checker 208, thereby advantageously achieving area savings (since delay circuits 222 associated with debug and trace may be omitted). In some embodiments, not checking for faults inside the debug and trace circuits 202a and 202b is not problematic as it may not affect operational safety of processing system 200 (e.g., may not affect the functional logic of main and shadow cores 202a and 202b, i.e., may not affect outputs of the instruction bus, data bus, and system bus from main and shadow cores 202a and 202b).

Processing system 200 may enter debug mode, for example, when a debugger is connected to processing system 200 (e.g., signal $S_{debug\_mode}$ may become high when debugger is connected to debug bus synchronizer 212). The debugger may interface with debug and trace circuit 206a in a conventional manner.

Debug and trace circuits 206a and 206b may be implemented in a conventional manner and may be used in a known manner to perform debug operations (e.g., setting programming breakpoints, pausing program execution, reading registers of main core 202a and 202b, etc.) and trace operations. Such operations may be performed offline, e.g., during software/firmware development and/or online (e.g., while a car is operational and, e.g., being driven/moving).

In some embodiments, delay circuits 222 are implemented with flip-flop in a known manner. For example, in some embodiments, a two-clock cycles delay may be implemented with 2 (e.g., D) flip-flops in series.

In some embodiments, processing system 100 is implemented in an integrated circuit, such as in a single monolithic semiconductor substrate.

In some embodiments, the design of main processing core 202a and shadow processing core 202b is substantially similar or identical. In some embodiments, each of processing cores 202a and 202b is configured to generate data and provide such data to redundancy checker 208 in a known manner via one or more buses, such as via an instruction bus, a data bus, and a system bus.

In some embodiments, redundancy checker 208 is configured to compare, in a known manner, outputs from main core 202a with corresponding outputs of shadow core 202b and assert signal $S_{alarm}$ when a discrepancy is detected. Redundancy checker 208 may be implemented in any way known in the art.

In some embodiments, FCU 260 triggers a reaction of processing system 200 when signal $S_{alarm}$ is asserted. For example, in some embodiments, FCU causes a reset of processing system 200 when signal $S_{alarm}$ is asserted. In some embodiments, FCU 260 may implement other types of reactions to the assertion of signal $S_{alarm}$, such as entering a safe mode, alerting a circuit external to processing system 200, etc. In some embodiments, FCU 260 may be implemented in a conventional manner.

Advantages of some embodiments include the capability of operating a processing system during debug mode (connected to a debugger) with an unmasked safety alarm, which may advantageously allow such processing system to remain in compliance with safety standards (e.g., ASIL-D) during debug mode (and may allow for vehicle calibration, such as the so called winter testing of a vehicle, with a debugger connected to the ECU). Additional advantages include the possibility of debugging safety faults, even in a moving vehicle (as the safety alarm is not masked during debug mode). Fault injection testing is advantageously possible in some embodiments.

In some embodiments, such advantages are achieved with minimal area penalties, as the area of a replicated debug and trace circuit may be relatively small compared to the area of the functional cores of the main and shadow processing cores.

Figure 3:
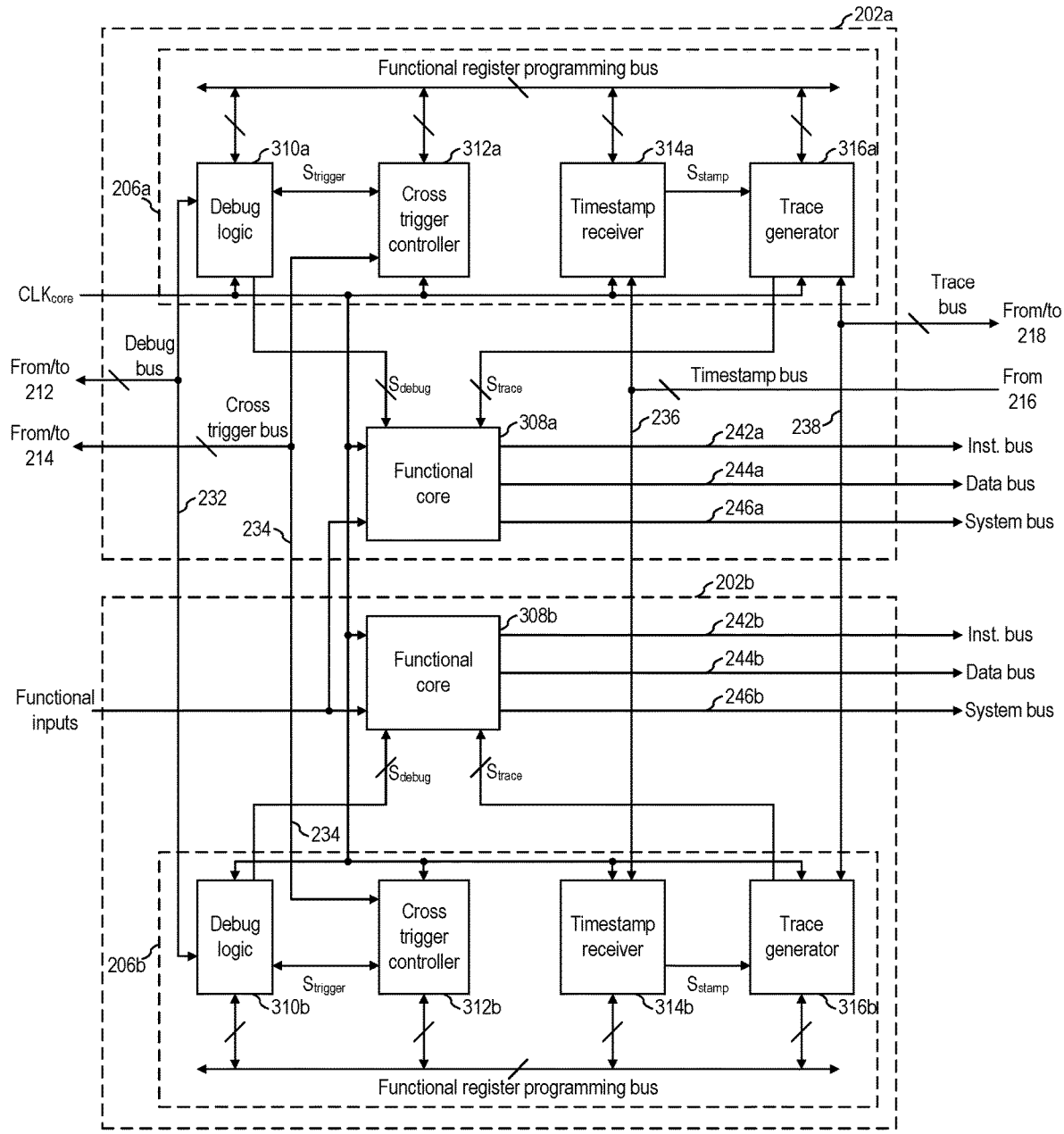
FIG. 3 shows a schematic diagram illustrating a possible implementation of the processing cores of FIG. 2, according to an embodiment of the present invention.

FIG. 3 shows a schematic diagram illustrating a possible implementation of processing cores 202a and 202b, according to an embodiment of the present invention. As shown, processing core 202b is a replica of processing core 202a, where processing core 202a includes functional core 308a and debug and trace circuit 206a; and where processing core 202b includes functional core 308b and debug and trace circuit 206b. Debug and trace circuit 206a includes debug logic 310a, cross trigger controller 312a, timestamp receiver 314a, and trace generator 316a. Debug and trace circuit 206b includes debug logic 310b, cross trigger controller 312ba, timestamp receiver 314b, and trace generator 316b.

During debug mode:

debug logic 310a receives data from debug bus 232 based on core clock $CLK_{core}$, and provides signal/bus $S_{debug}$ to functional core 308a in a known manner based on data received from debug bus 232;

debug logic 310b receives data from debug bus 232 based on core clock $CLK_{core}$, and provides signal/bus $S_{debug}$ to functional core 302b in a known manner based on data received from debug bus 232;

debug logic 310a receives data from debug bus 232 based on core clock $CLK_{core}$, and provides signal/bus $S_{debug}$ to functional core 308a in a known manner based on data received from debug bus 232;

cross trigger controller 312a receives data from cross trigger bus 234 based on core clock $CLK_{core}$ and provides signal/bus $S_{trigger}$ to debug logic 310a in a known manner based on data received from cross trigger bus 234;

cross trigger controller 312b receives data from cross trigger bus 234 based on core clock $CLK_{core}$ and provides signal/bus $S_{trigger}$ to debug logic 310b in a known manner based on data received from cross trigger bus 234;

timestamp receiver 314a receives timestamps from timestamp bus 236 based on core clock $CLK_{core}$ and provides timestamp signal/bus $S_{tamp}$ to trace generator 316a in a known manner based on timestamps received from timestamp bus 236;

timestamp receiver 314b receives timestamps from timestamp bus 236 based on core clock $CLK_{core}$ and provides timestamp signal/bus $S_{tamp}$ to trace generator 316b in a known manner based on timestamps received from timestamp bus 236;

trace generator 316a receives data from trace bus 238 based on core clock $CLK_{core}$ and provides signal/bus $S_{trace}$ to functional core 308a in a known manner based on the data received from trace bus 238;

trace generator 316b receives data from trace bus 238 based on core clock $CLK_{core}$ and provides signal/bus $S_{trace}$ to functional core 308a in a known manner based on the data received from trace bus 238;

functional core 308a provides data to debug logic 310a and trace generator 316a in a known manner;

functional core 308b provides data to debug logic 310b and trace generator 316b in a known manner;

debug logic 310a, cross trigger 312a, and trace generator 316a provide data, in a known manner, to buses 232, 234, and 238, respectively; and debug logic 310b, cross trigger 312b, and trace generator 316b do not provide data to buses 232, 234, and 238 (e.g., outputs of debug logic 310b, cross trigger 312b and trace generator 316b are not connected to buses 232, 234, and 238).

During debug mode, debug logic 310a and 310b are configured to pause/halt, in a known manner, execution of functional cores 308a and 308b, respectively, when a breakpoint is reached (e.g., using signal/bus $S_{debug}$). In some embodiments, debug logics 310a and 310b may be implemented in any way known in the art.

During debug mode, trace generator circuits 316a and 316b are configured to profile and check (e.g., in a known and non-invasive manner) the program flow of programs executed in functional cores 308a and 308b, respectively. In some embodiments, trace generator circuits 316a and 316b may cause the pausing/halting of execution of functional cores 308a and 308b (e.g., using signal/bus $S_{trace}$), e.g., when a trace buffer is full. In some embodiments, trace generator circuits 316a and 316b may be implemented in any way known in the art.

Timestamp circuits 314a and 314b are configured to provide, in a known manner, timestamps to trace generator circuits 316a and 316b, respectively, so that the traces/profiles generated by the trace generator circuits 316a and 316b are time-stamped. In some embodiments, timestamp circuits 314a and 314b may be implemented in any way known in the art.

Cross trigger controllers 312a and 312b are configured to manage debug operation between multiple processing cores. For example, during debug mode, if an additional core (not shown) of the system (e.g., a car) reaches a breakpoint, cross trigger controllers 312a and 312b cause, in a known manner, debug logics 310a and 310b, respectively, to pause/halt execution of the functional cores 308a and 308b, respectively. In that way, when a core of the system reaches a breakpoint, all cores of the system advantageously pause execution so that the state of the entire system can be debugged.

In some embodiments, pausing (also referred to as halting) the core comprises the gating clock $CLK_{core}$ (e.g., provided to functional cores 308a and 308b).

In some embodiments, functional processing cores 308a and 308b may be implemented as a generic or custom processor. For example, in some embodiments, processing cores 202a and 202b may be ARM-based or x86-based processors. Other implementations are also possible.

Advantages of some embodiments include the capability of operating a processing system during debug mode (connected to a debugger) with an unmasked safety alarm without monitoring (and without additional logic for monitoring) signals/buses $S_{debug}$ and $S_{trace}$ for faults.

Figure 4:
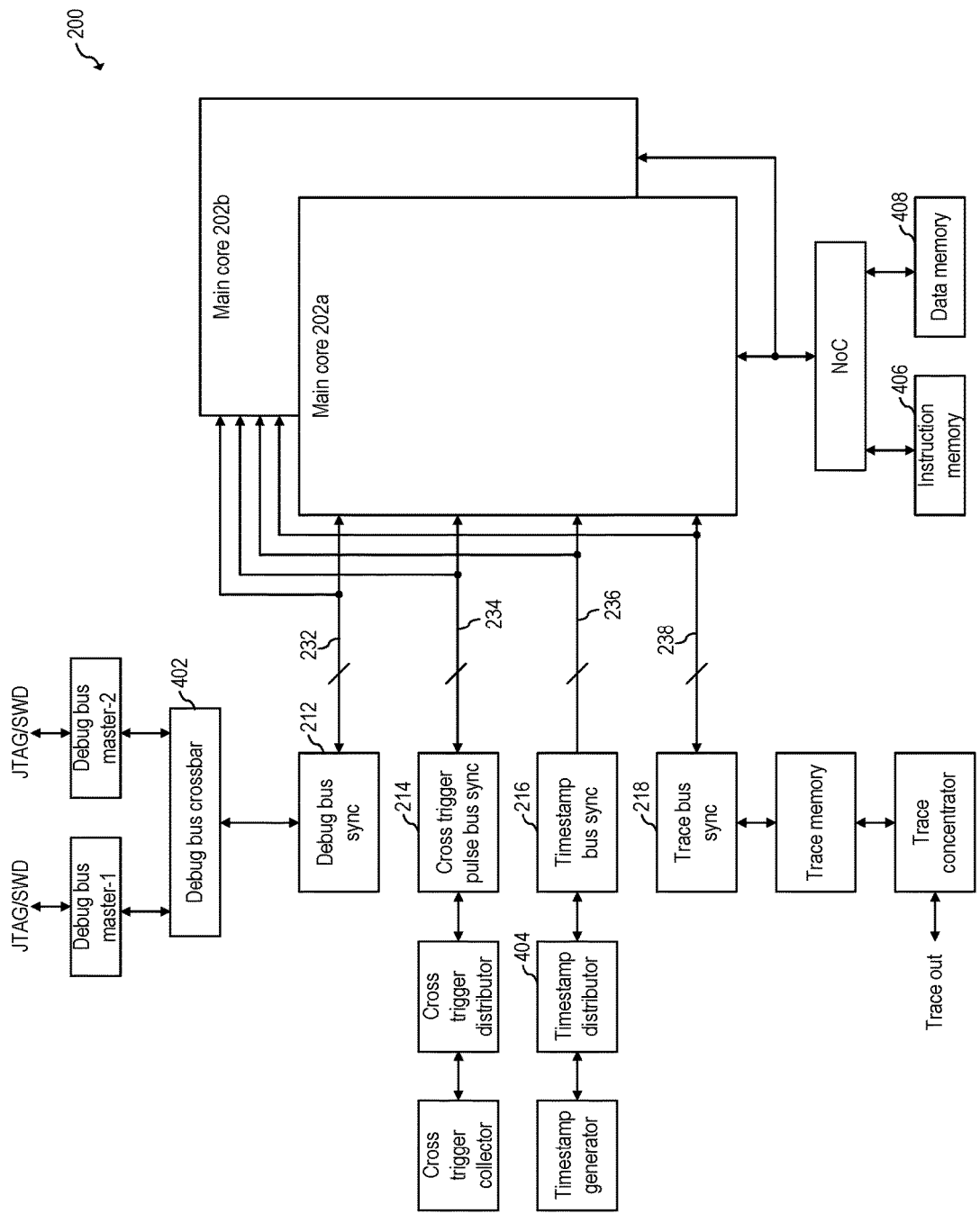
FIG. 4 shows a schematic diagram illustrating additional details of the processing system of FIG. 2, according to an embodiment of the present invention.

FIG. 4 shows a schematic diagram illustrating additional details of processing system 200, according to an embodiment of the present invention. As shown in FIG. 4, in some embodiments, the debugger may be a conventional joint test action group (JTAG) debugger.

In some embodiments, multiple replicated systems may be connected to debug crossbar 402.

In some embodiments, timestamps may be distributed to multiple processing cores via timestamp distributor (crossbar) 404.

In some embodiments, cross triggers are based on request-acknowledge handshakes. When a processing core completes the task based on received request, such processing core sets the acknowledge for the generated request. In some embodiments, full handshake-based asynchronous bridges are used for triggers.

In some embodiments, replicated processing cores (308a and 308b) access system memories (406 and 408) via instruction and data buses that are connected to both cores (308a and 308b).

Figure 5:
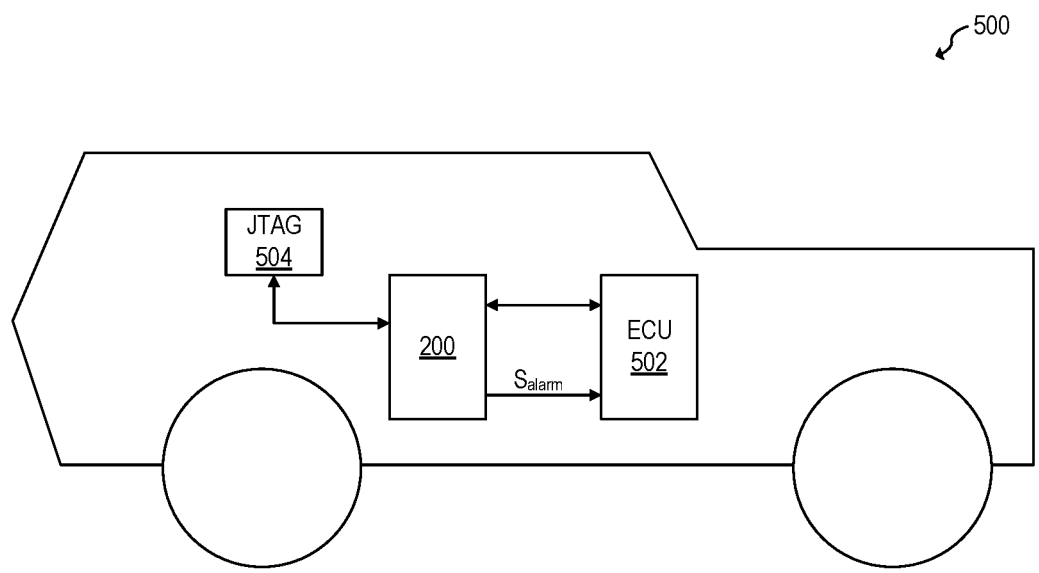
FIG. 5 illustrate a vehicle that includes the processing system of FIG. 2, according to an embodiment of the present invention.

FIG. 5 illustrate vehicle 500 that includes processing system 200, according to an embodiment of the present invention. Vehicle 500 includes electronic control unit (ECU) 502, and processing system 200.

As shown in FIG. 5, processing system 200 and ECU 502 may communicate in a known manner. Additionally, processing system 200 provides signal $S_{alarm}$ to ECU 502, which may be asserted during functional mode (e.g., when no debugger is connected to JTAG port 504) and during debug mode (when a debugger is connected to JTAG port 504) to alert ECU 502 of faults occurring in processing system 200 (e.g., faults associated with functional core 308a). In an embodiment, both processing system 200 and fault collection unit, which receives the faults from processing system 200, are existing in the same SoC. In some such embodiments, ECU 502 may not be used for fault collection.

Advantages of some embodiments includes the implementation of a processing system that complies with safety standards (e.g., ASIL-D) during debug mode based on legacy cores that may not have been designed to comply with safety standards during debug mode.

Example embodiments of the present invention are summarized here. Other embodiments can also be understood from the entirety of the specification and the claims filed herein.

Example 1. A processing system including: a main processing core including a main functional core and a main debug circuit, the main debug circuit having a debug input coupled to a debug bus and a debug output coupled to the debug bus; a shadow processing core including a shadow functional core and a shadow debug circuit, the shadow debug circuit having a debug input coupled to the debug bus, where the main and shadow processing cores are configured to operate in lockstep based on a core clock; a redundancy checker circuit configured to receive first outputs from the main and shadow functional cores and assert an alarm signal when a discrepancy between the first outputs from the main and shadow functional cores is detected; and a debug bus synchronizer circuit having a debug input configured to receive input debug data in synchrony with a debug clock, and an output coupled to the debug bus, where the debug bus synchronizer circuit is configured to provide synchronized debug data in synchrony with the core clock to the debug bus based on the input debug data, where the main and shadow debug circuits are configured to receive the synchronized debug data in synchrony with the core clock from the debug bus, and where the debug clock is asynchronous with respect to the core clock.

Example 2. The processing system of example 1, where the processing system is configured to react to an assertion of the alarm signal when a debugger is coupled to the debug input of the debug bus synchronizer circuit.

Example 3. The processing system of one of examples 1 or 2, where reacting to the assertion of the alarm signal includes resetting the processing system.

Example 4. The processing system of one of examples 1 to 3, where the main debug circuit includes main debug logic, and where the shadow debug circuit includes shadow debug logic, where, in response to an indication of a breakpoint in the debug bus, the main debug logic is configured to halt operation of the main functional core and, in parallel, the shadow debug logic is configured to halt operation of the shadow functional core.

Example 5. The processing system of one of examples 1 to 4, where the main debug circuit further includes a main cross trigger controller coupled to a cross trigger bus, where the shadow debug circuit further includes a shadow cross trigger controller coupled to the cross trigger bus, where, in response to an indication of a breakpoint in the cross trigger bus, the main cross trigger controller is configured to cause the main debug logic to halt operation of the main functional core and, in parallel, the shadow cross trigger controller is configured to cause the shadow debug logic to halt operation of the shadow functional core.

Example 6. The processing system of one of examples 1 to 5, where the main debug logic is configured to halt operation of the main functional core using a first debug signal, where the shadow debug logic is configured to halt operation of the shadow functional core using a second debug signal, and where the first and second debug signals are unmonitored for faults.

Example 7. The processing system of one of examples 1 to 6, where the main processing core further includes a main trace circuit having a trace input coupled to a trace bus and a trace output coupled to the trace bus, where the shadow processing core further includes a shadow trace circuit having a trace input coupled to the trace bus, the processing system further including a trace bus synchronizer circuit having a trace input configured to receive trace input data in synchrony with a trace clock, and an output coupled to the trace bus, where the trace bus synchronizer circuit is configured to provide synchronized trace data in synchrony with the core clock to the trace bus based on the input trace data, where the main and shadow trace circuits are configured to receive the synchronized trace data in synchrony with the core clock from the trace bus, and where the trace clock is asynchronous with respect to the core clock.

Example 8. The processing system of one of examples 1 to 7, where the debug input of the shadow debug circuit is coupled to the debug bus via a delay circuit, and where the debug input of the main debug circuit is coupled to the debug bus via a circuit path that does not include a delay circuit.

Example 9. The processing system of one of examples 1 to 8, where a debug output of the shadow debug circuit corresponding to the debug output of the main debug circuit is not coupled to the debug bus.

Example 10. The processing system of one of examples 1 to 9, where the first outputs from the main and shadow processing cores do not include outputs from the main and shadow debug circuits.

Example 11. The processing system of one of examples 1 to 10, where an electrical design of the main processing core and an electrical design of shadow processing core correspond to the same electrical design.

Example 12. The processing system of one of examples 1 to 11, where the processing system is integrated in an integrated circuit.

Example 13. A method including: transitioning from a functional mode of a processing system to a debug mode of the processing system after a debugger is coupled to the processing system, the processing system including a main and shadow processing cores operating in lockstep; and during functional mode: receiving functional inputs with a main functional core of the main processing system and with a shadow functional core of the shadow processing system, processing the functional inputs in parallel with the main and shadow functional cores in synchrony with a core clock, receiving debug data from the debugger in synchrony with a debug clock, the debug clock being asynchronous with the core clock, synchronizing the debug data to the core clock and providing the synchronized debug data to a debug bus in synchrony with the core clock, receiving the synchronized debug data from the debug bus with a main debug circuit of the main processing core and with a shadow debug circuit of the shadow processing core, comparing outputs from the main and shadow functional cores and asserting an alarm signal when a discrepancy between the outputs from the main and shadow functional cores is detected, and reacting to the assertion of the alarm signal.

Example 14. The method of example 13, where reacting to the asserting of the alarm signal includes resetting the processing system.

Example 15. The method of one of examples 13 or 14, where the debugger is a joint test action group (JTAG) debugger.

Example 16. The method of one of examples 13 to 15, further including, in response to receiving an indication of a breakpoint as part of the synchronized debug data, halt operation of the main functional core, and, in parallel, halt operation of the shadow functional core.

Example 17. The method of one of examples 13 to 16, further including providing first debug data from the main debug circuit to the debug bus without providing corresponding first debug data from the shadow debug circuit to the debug bus.

Example 18. The method of one of examples 13 to 16, where the processing system is part of a vehicle, and where reacting to the assertion of the alarm signal includes reacting to the assertion of the alarm signal while the vehicle is moving.

Example 19. A vehicle including: a debug port; an electronic control unit (ECU); and a processing system including: a main processing core including a main functional core and a main debug circuit, the main debug circuit having a debug input coupled to a debug bus and a debug output coupled to the debug bus, a shadow processing core including a shadow functional core and a shadow debug circuit, the shadow debug circuit having a debug input coupled to the debug bus, where the main and shadow processing cores are configured to operate in lockstep based on a core clock; a redundancy checker circuit configured to receive first outputs from the main and shadow functional cores and assert an alarm signal at an output terminal when a discrepancy between the first outputs from the main and shadow functional cores is detected, the output terminal of the redundancy checker circuit being coupled to the ECU; and a debug bus synchronizer circuit having a debug input coupled to the debug port and configured to receive input debug data in synchrony with a debug clock from the debug port, and an output coupled to the debug bus, where the debug bus synchronizer circuit is configured to provide synchronized debug data in synchrony with the core clock to the debug bus based on the input debug data, where the main and shadow debug circuits are configured to receive the synchronized debug data in synchrony with the core clock from the debug bus, and where the debug clock is asynchronous with respect to the core clock.

Example 20. The vehicle of example 19, where the debug port is a joint test action group (JTAG) port.

Example 21. The vehicle of one of examples 19 or 20, where the processing system is configured to enter debug mode in response to a debugger being plugged into the debug port, and where the processing system is configured to react to an assertion of the alarm signal during the debug mode.

Example 22. The vehicle of one of examples 19 to 21, where the main debug circuit includes a main debug logic coupled to the debug bus, and a main trace logic coupled to a trace bus, and where the shadow debug circuit includes a shadow debug logic coupled to the debug bus and a shadow trace logic coupled to the trace bus, where, in response to an indication of trace buffer being full, the main trace logic is configured to halt operation of the main functional core and, in parallel, the shadow trace logic is configured to halt operation of the shadow functional core.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A processing system comprising:
   a main processing core comprising a main functional core and a main debug circuit, the main debug circuit having a debug input coupled to a debug bus and a debug output coupled to the debug bus;
   a shadow processing core comprising a shadow functional core and a shadow debug circuit, the shadow debug circuit having a debug input coupled to the debug bus, wherein the main and shadow processing cores are configured to operate in lockstep based on a core clock;
   a redundancy checker circuit configured to receive first outputs from the main and shadow functional cores and assert an alarm signal when a discrepancy between the first outputs from the main and shadow functional cores is detected; and
   a debug bus synchronizer circuit having a debug input configured to receive input debug data in synchrony with a debug clock, and an output coupled to the debug bus, wherein the debug bus synchronizer circuit is configured to provide synchronized debug data in synchrony with the core clock to the debug bus based on the input debug data, wherein the main and shadow debug circuits are configured to receive the synchronized debug data in synchrony with the core clock from the debug bus, and wherein the debug clock is asynchronous with respect to the core clock.

2. The processing system of claim 1, wherein the processing system is configured to react to an assertion of the alarm signal when a debugger is coupled to the debug input of the debug bus synchronizer circuit.

3. The processing system of claim 2, wherein reacting to the assertion of the alarm signal comprises resetting the processing system.

4. The processing system of claim 1, wherein the main debug circuit comprises main debug logic, and wherein the shadow debug circuit comprises shadow debug logic, wherein, in response to an indication of a breakpoint in the debug bus, the main debug logic is configured to halt operation of the main functional core and, in parallel, the shadow debug logic is configured to halt operation of the shadow functional core.

5. The processing system of claim 4, wherein the main debug circuit further comprises a main cross trigger controller coupled to a cross trigger bus, wherein the shadow debug circuit further comprises a shadow cross trigger controller coupled to the cross trigger bus, wherein, in response to an indication of a breakpoint in the cross trigger bus, the main cross trigger controller is configured to cause the main debug logic to halt operation of the main functional core and, in parallel, the shadow cross trigger controller is configured to cause the shadow debug logic to halt operation of the shadow functional core.

6. The processing system of claim 4, wherein the main debug logic is configured to halt operation of the main functional core using a first debug signal, wherein the shadow debug logic is configured to halt operation of the shadow functional core using a second debug signal, and wherein the first and second debug signals are unmonitored for faults.

7. The processing system of claim 1, wherein the main processing core further comprises a main trace circuit having a trace input coupled to a trace bus and a trace output 8coupled to the trace bus, wherein the shadow processing core further comprises a shadow trace circuit having a trace input coupled to the trace bus, the processing system further comprising a trace bus synchronizer circuit having a trace input configured to receive trace input data in synchrony with a trace clock, and an output coupled to the trace bus, wherein the trace bus synchronizer circuit is configured to provide synchronized trace data in synchrony with the core clock to the trace bus based on the input trace data, wherein the main and shadow trace circuits are configured to receive the synchronized trace data in synchrony with the core clock from the trace bus, and wherein the trace clock is asynchronous with respect to the core clock.

8. The processing system of claim 1, wherein the debug input of the shadow debug circuit is coupled to the debug bus via a delay circuit, and wherein the debug input of the main debug circuit is coupled to the debug bus via a circuit path that does not include a delay circuit.

9. The processing system of claim 1, wherein a debug output of the shadow debug circuit corresponding to the debug output of the main debug circuit is not coupled to the debug bus.

10. The processing system of claim 1, wherein the first outputs from the main and shadow processing cores do not include outputs from the main and shadow debug circuits.

11. The processing system of claim 1, wherein an electrical design of the main processing core and an electrical design of shadow processing core correspond to the same electrical design.

12. The processing system of claim 1, wherein the processing system is integrated in an integrated circuit.

13. A method comprising:
transitioning from a functional mode of a processing system to a debug mode of the processing system after a debugger is coupled to the processing system, the processing system comprising a main and shadow processing cores operating in lockstep; and
during functional mode:
receiving functional inputs with a main functional core of the main processing system and with a shadow functional core of the shadow processing system,
processing the functional inputs in parallel with the main and shadow functional cores in synchrony with a core clock,
receiving debug data from the debugger in synchrony with a debug clock, the debug clock being asynchronous with the core clock,
synchronizing the debug data to the core clock and providing the synchronized debug data to a debug bus in synchrony with the core clock,
receiving the synchronized debug data from the debug bus with a main debug circuit of the main processing core and with a shadow debug circuit of the shadow processing core,
comparing outputs from the main and shadow functional cores and asserting an alarm signal when a discrepancy between the outputs from the main and shadow functional cores is detected, and
reacting to the assertion of the alarm signal.

14. The method of claim 13, wherein reacting to the asserting of the alarm signal comprises resetting the processing system.

15. The method of claim 13, wherein the debugger is a joint test action group (JTAG) debugger according to the IEEE Standard 1149.1-1990.

16. The method of claim 13, further comprising, in response to receiving an indication of a breakpoint as part of the synchronized debug data, halt operation of the main functional core, and, in parallel, halt operation of the shadow functional core.

17. The method of claim 13, further comprising providing first debug data from the main debug circuit to the debug bus without providing corresponding first debug data from the shadow debug circuit to the debug bus.

18. The method of claim 13, wherein the processing system is part of a vehicle, and wherein reacting to the assertion of the alarm signal comprises reacting to the assertion of the alarm signal while the vehicle is moving.

19. A vehicle comprising:
a debug port;
an electronic control unit (ECU); and
a processing system comprising:
a main processing core comprising a main functional core and a main debug circuit, the main debug circuit having a debug input coupled to a debug bus and a debug output coupled to the debug bus,
a shadow processing core comprising a shadow functional core and a shadow debug circuit, the shadow debug circuit having a debug input coupled to the debug bus, wherein the main and shadow processing cores are configured to operate in lockstep based on a core clock;
a redundancy checker circuit configured to receive first outputs from the main and shadow functional cores and assert an alarm signal at an output terminal when a discrepancy between the first outputs from the main and shadow functional cores is detected, the output terminal of the redundancy checker circuit being coupled to the ECU; and
a debug bus synchronizer circuit having a debug input coupled to the debug port and configured to receive input debug data in synchrony with a debug clock from the debug port, and an output coupled to the debug bus, wherein the debug bus synchronizer circuit is configured to provide synchronized debug data in synchrony with the core clock to the debug bus based on the input debug data, wherein the main and shadow debug circuits are configured to receive the synchronized debug data in synchrony with the core clock from the debug bus, and wherein the debug clock is asynchronous with respect to the core clock.

20. The vehicle of claim 19, wherein the debug port is a joint test action group (JTAG) port according to the IEEE Standard 1149.1-1990.

21. The vehicle of claim 19, wherein the processing system is configured to enter debug mode in response to a debugger being plugged into the debug port, and wherein the processing system is configured to react to an assertion of the alarm signal during the debug mode.

22. The vehicle of claim 19, wherein the main debug circuit comprises a main debug logic coupled to the debug bus, and a main trace logic coupled to a trace bus, and wherein the shadow debug circuit comprises a shadow debug logic coupled to the debug bus and a shadow trace logic coupled to the trace bus, wherein, in response to an indication of trace buffer being full, the main trace logic is configured to halt operation of the main functional core and, in parallel, the shadow trace logic is configured to halt operation of the shadow functional core.

* * * * *